United States Patent
Nakayama et al.

(10) Patent No.: US 7,195,545 B2
(45) Date of Patent: Mar. 27, 2007

(54) CHAMFERED FREESTANDING NITRIDE SEMICONDUCTOR WAFER AND METHOD OF CHAMFERING NITRIDE SEMICONDUCTOR WAFER

(75) Inventors: Masahiro Nakayama, Hyogo (JP); Masato Irikura, Hyogo (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 408 days.

(21) Appl. No.: 10/662,524

(22) Filed: Sep. 16, 2003

(65) Prior Publication Data

US 2004/0195658 A1  Oct. 7, 2004

(30) Foreign Application Priority Data

Apr. 2, 2003  (JP)  ............ 2003-098979
Jul. 17, 2003  (JP)  ............ 2003-275935

(51) Int. Cl.
    *B24B 1/00*  (2006.01)
(52) U.S. Cl. .................................... 451/44; 451/59
(58) Field of Classification Search ............ 451/42–44, 451/59, 60, 168, 169, 296; 438/690–692
See application file for complete search history.

(56) References Cited

U.S. PATENT DOCUMENTS

| 6,402,596 | B1 | 6/2002 | Hakomori et al. |
| 6,410,438 | B1 | 6/2002 | Ozaki |
| 6,629,875 | B2 * | 10/2003 | Steere, III ............... 451/9 |
| 6,933,234 | B2 * | 8/2005 | Nakamura et al. ........ 438/690 |
| 2002/0068201 | A1 | 6/2002 | Vaudo et al. |
| 2002/0098787 | A1 | 7/2002 | Kunisawa et al. |
| 2002/0142707 | A1 * | 10/2002 | Shimada et al. .......... 451/44 |

FOREIGN PATENT DOCUMENTS

| EP | 1 034 883 | 9/2000 |
| EP | 1 120 191 | 8/2001 |
| JP | 03-001535 | 1/1991 |
| JP | 03-280537 | 12/1991 |
| JP | 6-315830 | 11/1994 |
| JP | 09-109010 | 4/1997 |
| JP | 9-181021 | 7/1997 |
| JP | 2002-208572 A | 7/2002 |
| JP | 2002-356398 A | 12/2002 |
| JP | P2002-356398 A | 12/2002 |

* cited by examiner

*Primary Examiner*—Dung Van Nguyen
(74) *Attorney, Agent, or Firm*—McDermott Will & Emery LLP

(57) ABSTRACT

Technology of making freestanding gallium nitride (GaN) wafers has been matured at length. Gallium nitride is rigid but fragile. Chamfering of a periphery of a GaN wafer is difficult. At present edges are chamfered by a rotary whetstone of gross granules with weak pressure. Minimum roughness of the chamfered edges is still about Ra 10 μm to Ra 6 μm. The large edge roughness causes scratches, cracks, splits or breaks in transferring process or wafer process. A wafer of the present invention is bevelled by fixing the wafer to a chuck of a rotor, bringing an edge of the wafer into contact with an elastic whetting material having a soft matrix and granules implanted on the soft matrix, rotating the wafer and feeding the whetting material. Favorably, several times of chamfering edges by changing the whetting materials of smaller granules are given to the wafer. The chamfering can realize small roughness of Ra 10 nm and Ra 5 μm at edges of wafers.

2 Claims, 3 Drawing Sheets

US 7,195,545 B2

CHAMFERED FREESTANDING NITRIDE SEMICONDUCTOR WAFER AND METHOD OF CHAMFERING NITRIDE SEMICONDUCTOR WAFER

BACKGROUND OF THE INVENTION

1. Field of the Invention

This invention relates to an improvement of an edge (periphery) of a nitride semiconductor single crystal circular wafer. The edge means a periphery of a wafer. An as-cut wafer has a sharp edge which causes break, crack, split, chip or scratch of the wafer. Then, the edge part is slantingly polished into a round periphery. The slanting polishing of edges is called "bevelling" or "chamfering" for discriminating the edge slanting polishing from flat polishing of wafer surfaces. Semiconductor nitrides mean gallium nitride (GaN), indium nitride (InN) and aluminum nitride (AlN). The nitrides are rigid but fragile materials. Processing of semiconductor nitride wafers is far more difficult than silicon (Si) wafers or gallium arsenide (GaAs) wafers.

This application claims the priority of Japanese Patent Application No. 2003-98979 filed on Apr. 2, 2003 and Japanese Patent Application No. 2003-275935 filed on Jul. 17, 2003, which are incorporated herein by reference.

It has been very difficult to produce a large good semiconductor nitride bulk single crystal wafer. Someone has recently succeeded in producing freestanding GaN wafers on a small scale. Most of the freestanding GaN wafers are still small rectangular plates whose side is about 10 mm to 20 mm. Technology of producing GaN wafers is still not fully matured for serving GaN crystals as a substrate wafer of making InGaN type blue light lasers on a mass-production scale. Circular single crystal wafers of InN and AlN have not been yet produced except experimental trials.

At length, the production of circular GaN single crystal wafers becomes feasible. An unprocessed sharp edge of an as-cut wafer causes cracks, scratches or breaks of the wafer. Peripheral parts (edges) of semiconductor wafers are used to be slantingly polished for avoiding occurrence of cracks or breaks. The process of polishing wafer peripheries into slanting edges is called "bevelling" or "chamfering". Bevelling or chamfering has been one of established processes in the case of silicon wafers or gallium nitride wafers for which production technology has been fully matured. Silicon wafers are rigid, sturdy and tough. A silicon wafer is chamfered by bringing a periphery of the wafer into contact with a rotary whetstone, rotating both the whetstone and the wafer in reverse directions and polishing the periphery into a slanting, round edge. Toughness of silicon enables rotary whetstones to chamfer edges of silicon wafers.

2. Description of Related Art

1̂ Japanese Patent Laying Open No.9-181021, "Beveling method of wafer", proposed a method of bevelling a silicon wafer by a sophisticated diamond rotary whetstone including 5 wt. % to 30 wt. % of ultrafine diamond particles of a diameter from 3 nm to 18 nm and 70 wt. % to 95 wt. % of small sized diamond granules of a diameter from 5 μm (5000 nm) to 8 μm (8000 nm). This is a complex rotary whetstone including two different kinds of whetting granules, one is the ultrafine particles and the other is the small particles. 1̂ wrote that the conventional rotary whetstones had been composed of gross granules of an average diameter of 15 μm to 30 μm for chamfering silicon wafers and the gross granules caused breaks of wafers or cracks on wafers. For avoiding the beaks and cracks, 1̂ proposed silicon wafer bevelling by the fine particle whetstone. Use of the ultrafine particles of a diameter of 3 nm to 18 nm suppresses cracks or breaks from occurring. The small sized particles of a diameter of 5 μm to 8 μm were intentionally used for compensating for delay of chamfering induced by the ultrafine particles. 1̂ was an improvement of bevelling silicon wafers by a fine particle implanted rotary whetstone for avoiding occurrence of breaks and cracks.

2̂ Japanese Patent Laying Open No.6-315830, "Beveling method for cut-resistant material", proposed an electrolytic bevelling method for silicon wafers. 2̂ complained that silicon wafers were too rigid and resistant to mechanically bevel and diamond whetstones should be used for silicon bevelling which raised the cost of silicon chamfering. The electrolysis method of 2̂ supplies silicon wafers with an electrolyte, applies voltage to the silicon wafer via the electrolyte and chamfers edges of the wafers by the action of electrolysis. 1̂ and 2̂ are improvements of silicon wafer bevelling.

3̂ Japanese Patent Laying Open No. 2002-356398 (Date of publication of application: Dec. 13, 2002), "Gallium nitride wafer", proposed an invention of bevelling of GaN wafers by the same invention as the present invention.

Current chamfering technology of the inventors of the present invention has chamfered a circular GaN wafer by making use of a rotary metal-bonded circular whetstone having implanted diamond granules of #100 mesh to #400 mesh (optimum mesh; #200), circumscribing a circular wafer to the rotary whetstone, and rotating the rotary whetstone and the wafer in inverse directions at 800 m/min to 2000 m/min which is an ordinary range of rotation speed, as shown in FIG. 1. A periphery 6 of the circular wafer 2 is pushed to a concave rotary whetstone 3 which wears fixed diamond granules on an outer round surface. The wafer 2 is circumscribed with the rotary whetstone 3. A liquid is supplied to the rotary whetstone 3 and the wafer 2. The rotary whetstone 3 rotates at a high speed in a direction. The wafer is also rotated in an inverse direction at a low speed. The implanted granules abrade the periphery of the wafer at a high rate. The circumscribing contact applies strong shocks upon the edge of the wafer. It takes about ten minutes to twenty minutes to eliminate a diametrical 1 mm wide margin. It is rapid bevelling. A final shape of the edges is determined in accordance with the standard of the SEMI (Semiconductor Equipment and Materials International).

FIG. 5 depicts sizes of parts of a 2-inch GaN wafer in the chamfering steps. A necessary bevelling margin is a radial 1 mm width. An initial wafer has a 52 mm diameter and a 520 μm thickness. Before chamfering, an orientation flat OF and an identification flat IF are formed at peripheral portions by a dicer or a grinding whetstone for signifying crystallographical orientations. A final length of the OF should be 16 mm. A length of the IF should be 7 mm. The OF line should be cut along a line distanced by 2.32 mm from a point on the circumference. The OF is usually a cleavage plane {1–100}. The IF line should be cut along another line distanced by 1.25 mm at another point on the circumference. The IF is vertical to the OF. Relative positions of the OF and the IF are determined for clockwise aligning in the order when a facing surface is a top surface. Sizes of parts are predetermined as such.

Prior edge processing of the inventors of the present invention chamfers, for example, a 52 mmφ GaN wafer having OF and IF by circumscribing the wafer with a metal-bonded diamond rotating whetstone, rotating the diamond whetstone, grinding a circumference of the wafer till the outer diameter of the GaN wafer is reduced to 50 mmφ, as shown in FIG. 1. The diameter should be reduced by 2 mm. The periphery which is eliminated away is called a polishing margin. The polishing margin is 1 mm in radius or identically 2 mm in diameter. Hard diamond fixed granules have a strong force of abrading rugged wafer edges. Such bevelling for the diametrical 2 mm margin takes only about 20 minutes to 40 minutes. The processing time is short enough. The processing improves roughness of the wafer down to about Ra 10000 nm to Ra 6000 nm (Ra 10 µm to Ra 6 µm) in the best case. However, the yield of chamfering is low. Sometimes the periphery is scratched or chipped in the chamfering step. Sometimes the wafer cracks or breaks. Impulsive contact with the hard rotary whetstone is often destructive for the wafer. Ra 6 µm is the lowest limit in the circumscribing rotary contact whetstone. It is desired to reduce the roughness less than Ra 5 µm. But, such smoothness less than Ra 5 µm is beyond the power of the metal-bonded circumscribing rotary whetstone rotating at an ordinary speed. It may supposed that a very slow rotation whetstone will be able to bevel the fragile GaN wafer without scratching, chipping or cracking. A ten-hour whetting making use of the same metal-bonded diamond rotary whetstone succeeded in chamfering a circumference to roughness of about Ra 3 µm. However, the slow whetting has drawbacks of excess dissipation of whetstones, jamming of meshes with dust and big fluctuation of final properties of the wafer. The long-time whetting is not practical for giving mirror smoothness to GaN wafers.

Whetting powder of #200 is far coarser powder than the whetting powder for polishing the silicon wafers described in the previously cited 1̂ Japanese Patent Laying Open No.9-181021, "Beveling method of wafer". Thus, a wafer polished by the #200 powder has a rough surface of Ra 10 µm to Ra 6 µm.

The inventors had employed the coarse whetting powder for bevelling GaN wafers. GaN wafers are rigid but fragile. The rigidity forced the inventors to employ the coarse powder. It is, however, difficult to finish GaN wafers due to the fragility. If a GaN wafer is in outer-contact with a rotating whetstone and the edge is bevelled by the rotating whetstone, the edge or the whole of the wafer breaks during the bevelling process with high frequency. Even if the edges are not broken, the chamfered edges suffers from high roughness of Ra=10 µm to 6 µm as described before.

It may be perhaps effective to use rotating whetstones of fine granules of smaller diameters for reducing the occurrence of scratches. However, employment of smaller-sized whetting granules requires longer time for polishing edges of wafers, which raises cost of edge polishing. Use of the fine granule whetstones has other drawbacks of raising the probability of cramming meshes with whetting wastes and shortening the lifetime of whetstones.

One purpose of the present invention is to provide a freestanding gallium nitride wafer which is free from occurrence of cracks from peripheral parts (edges).

Another purpose of the present invention is to provide a freestanding gallium nitride (GaN) wafer which is free from occurrence of scratches or breaks from edges.

Another purpose of the present invention is to provide a freestanding gallium nitride (GaN) wafer with clean edges which do not invite particle adhesion or waste contamination. A further purpose of the present invention is to provide a method of chamfering an edge of a nitride wafer without incurring scratching, splitting or breaking of the wafer. A further purpose of the present invention is to provide a method of chamfering an edge of a nitride wafer without clogging of meshes with whetting materials. This invention is also applicable to other nitride semiconductor wafers of aluminum nitride (AlN) or indium nitride (InN) besides GaN.

SUMMARY OF THE INVENTION

The present invention proposes a nitride semiconductor wafer having an edge bevelled to roughness Ra smaller than Ra 5 µm but larger than Ra 10 nm (10 nm≦Ra≦5 µm). The roughness less than Ra 5 µm enables the nitride wafer to reduce a crack occurrence rate under 50%.

More favorably, the present invention proposes a nitride semiconductor wafer with a smooth edge bevelled to roughness Ra smaller than Ra 1 µm but larger than Ra 10 nm (10 nm≦Ra≦1 µm). The edge roughness less than Ra 1 µm allows the wafer to decrease a crack occurrence rate under 10%.

Furthermore, the present invention proposes a edge roughness less than Ra 0.1 µm for a nitride semiconductor wafer. The small roughness less than Ra 0.1 µm can suppress a crack occurrence rate under 6%.

In any cases, the lowest limit of roughness is Ra 10 nm. Ra 10 nm is the limit restricted by the method of the present invention relying upon whettapes. Ra 10 nm is equal to a value in a scope of minute flat surface polishing. The edges need not have extremely high flatness equivalent to the flatness of surfaces.

Thus, the present invention proposes a nitride wafer having edge roughness of,
(1) Ra 5 µm~Ra 10 nm,
(2) Ra 1 µm~Ra 10 nm or
(3) Ra 0.1 µm~Ra 10 nm.

FIG. 6 shows a section of a GaN wafer having an edge which is bevelled by an apparatus of the present invention. The edge is polished into a round shape. The polished edge can have flat portions instead of the round portions. Polishing of the edge portion is done by a whetting material which has a flexible body and continuously supply a cutting edge to an object wafer, for example, a whettape. The tape-polishing can realize a natural round shape of the edges.

Smoothing the edge of wafers reduces an occurrence rate of cracks and enhances yield of producing good wafers. The smooth edges also decrease the probability of breaks and cracks on wafer processes.

Rotation whetstones, however, are not suitable for polishing edges of GaN wafers, because GaN is fragile. The present invention employs whettapes instead of the rigid rotation whetstones. Whettapes mean a continual coiled tape paper or cloth implanted with polishing granules 5. FIG. 2 and FIG. 3 show a polishing process by bringing an edge 6 of a wafer 2 into contact with a whettape 4, rotating the wafer 2 and polishing the edge 6 of the wafer 2. The whettape 4 is soft enough to bend into arbitrary curvatures, because a base is paper or cloth which is rich in elasticity.

Besides, a contacting area between a wafer and a whetting material differs. A conventional rotating whetstone is in outer-contact with an edge of an object wafer. The contact is a spot contact in the conventional wafer/whetstone. An effective area of the contact is very narrow. The contacting pressure per unit area is quite strong. The strong pressure is apt to break wafers in the conventional rotating whetting.

The whettape shown in FIG. 3, however, has a larger effective contacting area indicated by points EFG with the wafer, because the whettape flexibly bends along the wafer. As shown in FIG. 3, the wafer 2 is inscribed in the whettape 4 at the points E, F and G. Since the whettape 4 has elasticity, a central angle EOG of the wafer 2, which shows a contacting area between the wafer and the whettape, can be 40 degrees to 90 degrees. The contacting area is wide along a circumference of the wafer as illustrated in FIG. 3 and is also wide along a thickness of the wafer as shown in FIG. 2. Therefore, since the contacting area is wide in the case of the whettape, a contacting pressure per unit area can be far smaller than that of the conventional whetstone. Probability of occurrence of breaks of wafers in process can be effectively suppressed.

Probability of occurrence of clogging is higher in finer whetstones than in grosser whetstones in the case of rotary whetstones. Unlike the rotary whetstones, the whettapes always renew whetting granules 5 implanted on a continual cloth tape at a feeding speed U. The continual renewal of acting granules prevents whetdust from remaining and from jamming into gaps of granules. Due to the continual replacement of granules, the whettape is immune from the occurrence of clogging of whetdust. Suppression of clogging enables the whettape to make use of far finer granules than the ordinary rotary whetstone.

Advantages of the present invention are described. The invention proposes a freestanding nitride wafer having an edge of high smoothness of Ra 10 nm to Ra 5 μm and a method of chamfering a circular freestanding nitride wafer by a whettape having implanted granules. The whettape is rich in elasticity, softness, shock-absorption and toughness. The whettape inscribes an edge of a wafer, which increases a contact length and reduces the force per unit area. Such features of the whettape reduce the probability of splitting, scratching or breaking in chamfering steps and enhance the final obtainable edge smoothness to Ra 10 nm to Ra 100 nm. Feeding of the whettape renews contacting granules and prevents the fixed granules from being jammed with waste.

Prior bevelling by the rotary whetstones can chamfer the edges of circular wafers to Ra 10 μm to Ra 6 μm at best. It is impossible to obtain smoothness under Ra 6 μm by the prior rotary whetstone method. As shown in FIG. 4, the roughness of Ra 10 μm to Ra 6 μm incurs over 60% of a crack occurrence rate. An upbeat of edge smoothness enables the present invention to reduce the probability of occurrence of cracks and raise the yield of bevelling. FIG. 4 indicates Ra 5 μm, which corresponds to the upper limit of the present invention and invites cracks at a 50% rate. This invention can produce good wafers with a crack occurrence rate less than 50%.

Preferable smoothness is Ra 1 μm to Ra 10 nm. The roughness under Ra 1 μm ensures the present invention to reduce the crack occurrence rate to less than 10%.

Further favorable smoothness is Ra 0.1 μm to Ra 10 nm. The roughness under Ra 100 nm decreases the crack occurrence probability under 6%.

In addition to the cracks, the present invention can decrease the probability of breaks, splits, crashes and contamination by waste, dust or foreign materials in wafer processes and in conveying processes through the enhanced smoothness of wafer edges. GaN, AlN and InN freestanding wafers of high quality are obtained by the present invention.

DETAILED DESCRIPTION OF THE PREFERRED EMBODIMENTS

Figure 1:
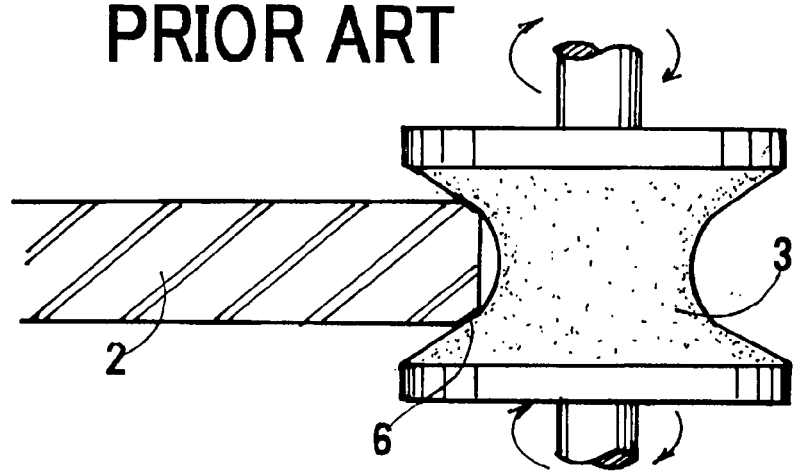
FIG. 1 is a sectional view of a spool-shaped rotating whetstone with an inner curved polishing surface for bevelling edges of a wafer for illustrating a conventional wafer bevelling method.
Figure 2:
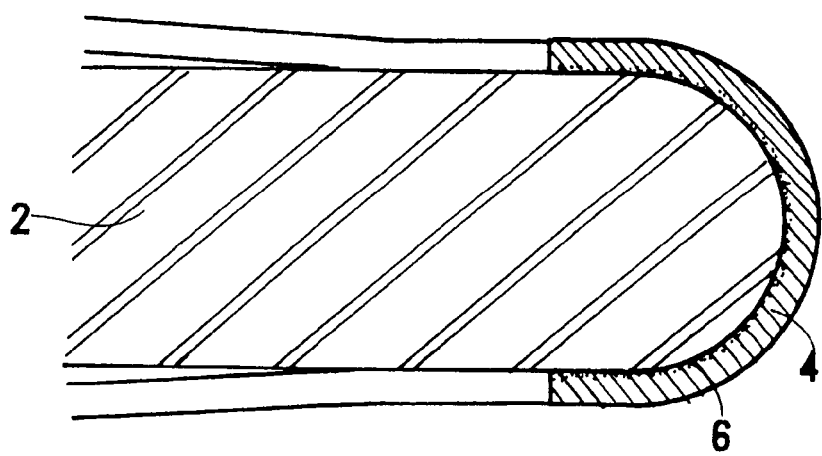
FIG. 2 is a vertically sectioned view of a part of a freestanding GaN wafer and an elastic whettape being in contact with an edge of the GaN wafer and running in an angular direction around the edge for showing a wafer bevelling method of the present invention.
Figure 3:
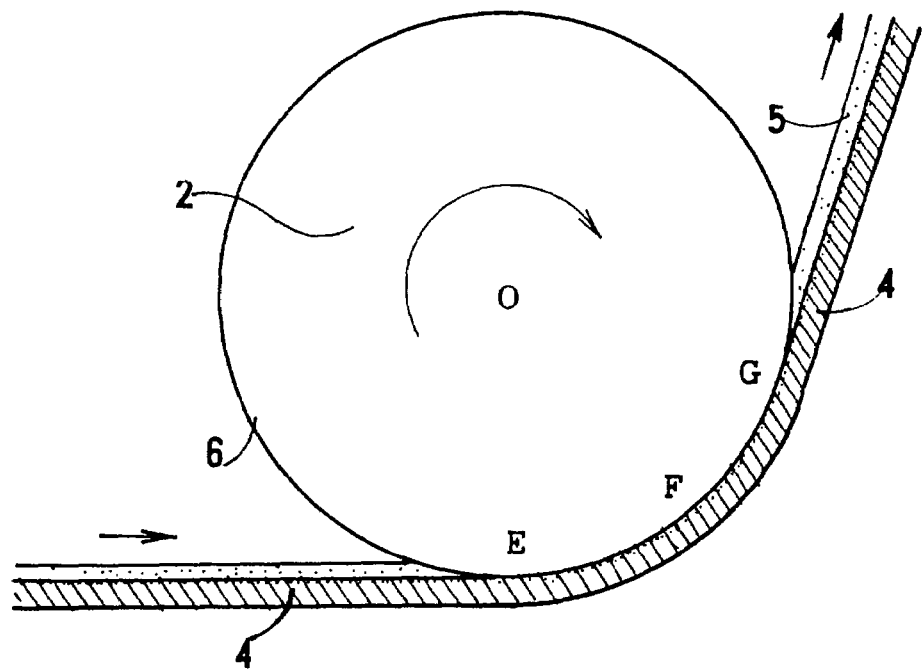
FIG. 3 is a horizontally sectioned view of a part of the freestanding GaN wafer and the elastic whettape being in contact with the edge of the GaN wafer and running in an angular direction around the edge for showing a wafer bevelling method of the present invention.

The present invention proposes a chamfering method of bringing an edge of a circular nitride wafer to a whettape, rotating the nitride wafer in contact with the whettape, feeding the whettape and polishing the edge of the wafer to roughness Ra between Ra 5000 nm and Ra 10 nm, more favorable roughness between Ra 1000 nm and 10 nm and the best case roughness between Ra 100 nm and Ra 10 nm. This invention further proposes a nitride wafer having a chamfered edge of roughness Ra of (1) Ra 5000 nm to Ra 10 nm, more favorable edge roughness of
(2) Ra 1000 nm to Ra 10 nm, and the best edge roughness of
(3) Ra 100 nm to Ra 10 nm.

The whettape method of the present invention polishes a periphery of a GaN (or InN or AlN) wafer by bringing an edge of the wafer in contact with a whettape having implanted granules, rotating the GaN wafer in the enclosing whettape and feeding the whettape at a slow speed. Unlike the rotating whetstone, the whettape polishing of the present invention rotates the wafer. The powder granules are implanted on a soft, elastic cloth or paper. The whettape can be made of cloths, polyurethane, leather, rubber or paper. Elastic and soft contact with the whettape absorbs shocks and alleviates the force acting upon the wafer from a whetting machine. The whetting granules are, for example, silicon carbide (SiC), alumina ($Al_2O_3$), diamond (C) or silica.

And, a liquid for whetting can be also used with the granules and the liquid includes silicon carbide (SiC), alumina ($Al_2O_3$), diamond (C) or colloidal silica. The tape for whetting is made of cloths, polyurethane, leather, rubber, or paper. Since the whettape is in inscribing contact with the edge, a contacting region is still wider than the case of the ordinary rotary whetstone which circumscribes a wafer. The wide contact area can reduce pressure (force per unit area) acting between the whetting matter and the wafer. The favorable pressure is 1 kg/cm$^2$ to 10 kg/cm$^2$. Continual renewal (feeding) of the whettape inhibits the mesh from jamming with dust. Soft touch of powder, the shock-absorbing tape, the inscribing contact, slow rotation and long time processing can afford to give edges of wafers mirror-smoothness without incurring splits, scratches, breaks and cracks.

Adjustable variables are sizes (average diameter or mesh number #) of granules implanted upon the whettape, a contacting force F between the whettape and wafer edge, a line velocity V (angular velocity x radius), a polishing time H, a tape feeding speed U and an abrasive liquid. A single-step polishing, a two-step polishing, a three-step polishing and an over-three step polishing are available for the whet-tape method. In the case of multiple-steps, tapes having larger granules are followed by tapes having smaller granules. A larger mesh number (#) means a smaller average diameter of granules.

Mesh sizes of granules applied to a pertinent whettape should be #300 to #5000, more favorably, #500 to #3000. Suitable feeding speeds of the whettape which depend upon granule mesh sizes are 5 mm/min to 60 mm/min, more favorably, 10 mm/min to 30 mm/min. A whettape implanted with larger granules is more powerful to abrade edges but is unable to produce high-smoothness of the edge. Another whettape implanted with smaller granules is more subject to suffer from abrasion wearing, which should require higher speed of feeding. A single step of a single whettape is available. A plurality of steps with different mesh whettapes are also effective. For example, a first step employs a whettape of #300 to #1000, a second step employs another whettape of #1000 to #2500 and a third step employs another whettape of #2500 to #5000. Unlike the ordinary rotary whetstones, current whetting portions of the tape can be continually renewed with the feeding of the whetting tape. The continuous renewal of whetting cloth parts prevents implanted small granules from jamming with waste and maintains good polishing performance.

Since the tapewhetting is substantially a kind of mechanical polishing, a suitable polishing liquid is, for example, powder including water, powderless water, powder including oil and powderless oil. The polishing liquid has functions of cooling the contacting portions, reducing abrasion resistance, alleviating shocks acting upon edges of the object wafer and raising yield of chamfering. Necessary polishing time depends upon sizes of granules implanted on the tape. Gross-chamfering making use of larger granule tapes consumes short time. Minute chamfering processed by smaller granule tapes requires long time.

The processing time H varies at the steps of chamfering. Each step requires one hour to ten hours. The smaller the granules are, the longer time the bevelling step requires. The present invention has a drawback of requiring longer processing time than the conventional rotary whetstones which take only twenty minutes to forty minutes. The time-consuming drawback of the present invention can be compensated by an improvement of roughness Ra of edges of wafers.

About seven hour polishing reduces the wafer diameter by about 2 mm. About 13 m of a whettape is consumed for edge-polishing of one wafer at the polishing rate. Neither cracks nor splits occur. Final roughness of the edges is Ra 10 nm to Ra 5 µm. More favorable cases obtain final roughness between Ra 10 nm and Ra 1 µm. The most favorable case enjoys final roughness between Ra 10 nm and Ra 100 nm. The length of whettape per wafer would be able to be decreased down to about 10 m. This invention can be applied to other nitride semiconductor wafers, aluminum nitride (AlN) wafers and indium nitride (InN) wafers.

[Embodiment]

Figure 5:
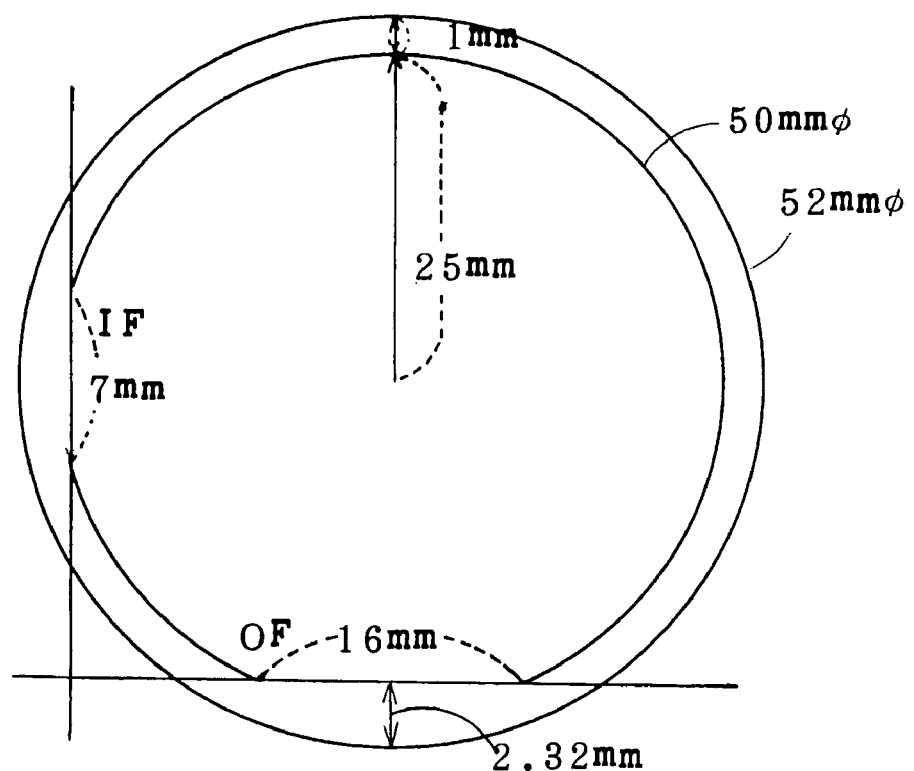
FIG. 5 is a graph showing sizes of an original freestanding 2-inch φ GaN wafer which has a 52 mm diameter and a 520 μm thickness, and a processed wafer having an orientation flat (OF), an identification flat (IF) made on edges of the wafer by edge grinding and an edge which is polished and reduced by 2 mm diameter (1 mm radius) by a whettape in accordance with the teaching of the present invention.
Figure 6:
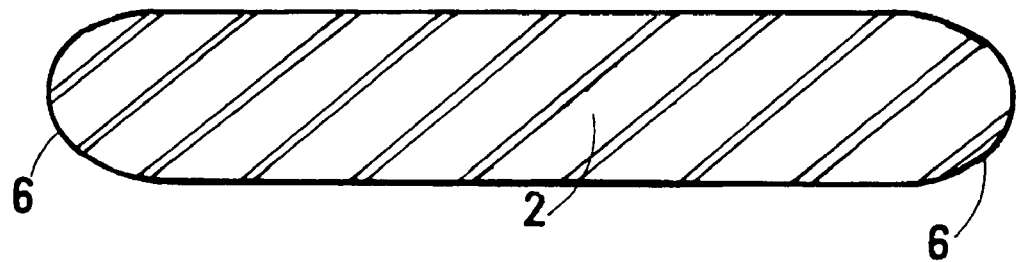
FIG. 6 is a sectional view of a GaN wafer which has an edge polished by a whettape into a predetermined surface roughness.

A starting wafer is an as-grown GaN wafer of a 52 mm diameter and a 520 µm thickness. An orientation flat (OF, 16 mm of a final length) and an identification flat (IF, 7 mm of a final length) are formed on sides of the GaN wafer by, for example, a dicer. FIG. 5 shows a plan view of the object GaN wafer for showing sizes of the wafer. A 52 mmφ outer full circle denotes an original size of the object wafer before edge-polishing. A left straight line shows a cutting line for the IF formation. A bottom straight line denotes a cutting line for the OF formation. A 1 mm wide edge part is eliminated by the edge polishing. A 50 mmφ inner circle shows the edge-polished wafer. Since a 1 mm wide peripheral circular part is eliminated, the lengths of the left IF line and the bottom OF line are reduced to the predetermined lengths of 7 mm and 16 mm.

The original 52 mmφ wafer is fixed to a chuck of a rotor by aligning centers. At a first bevelling step, an endless gross whettape of #800 mesh is used for bevelling an edge of the GaN wafer. The edge of the wafer is brought into contact with the whettape with a pressure of 7 kg/cm$^2$. The wafer is rotated at a suitable speed in the state of contact with the whettape. The whettape is fed at a feeding speed of U=10 mm/min. Water is supplied as a coolant to the polished wafer and the whettape. The wafer edge is chamfered for two hours by the #800 mesh whettape. The roughness is measured by an AFM (atomic force microscope). The first chamfering step using the #800 mesh whettape reduces roughness of the edge to Ra 0.9 µm (=Ra 900 nm).

At a second step, another middle whettape of #2000 mesh is utilized. The gross-polished edge of the wafer is further chamfered by the #2000 mesh whettape at a 20 mm/min feeding speed (U=20 mm/min) with a pertinent pressure. Five-hour bevelling gives the edge a roughness of Ra 0.3 µm (=Ra 300 nm) by measurement on the AFM.

At a third step, a fine whettape of #3000 mesh is further utilized. The wafer edge is further bevelled for 6.5 hours by the whettape which is fed at a feeding speed of U=30 mm/min. The roughness of the edge is reduced down to Ra 0.1 µm=Ra 100 nm by the AFM measurement. A series of the three chamfering steps by the whettapes succeeded in obtaining a smooth edge of roughness Ra 0.1 µm.

Figure 4:
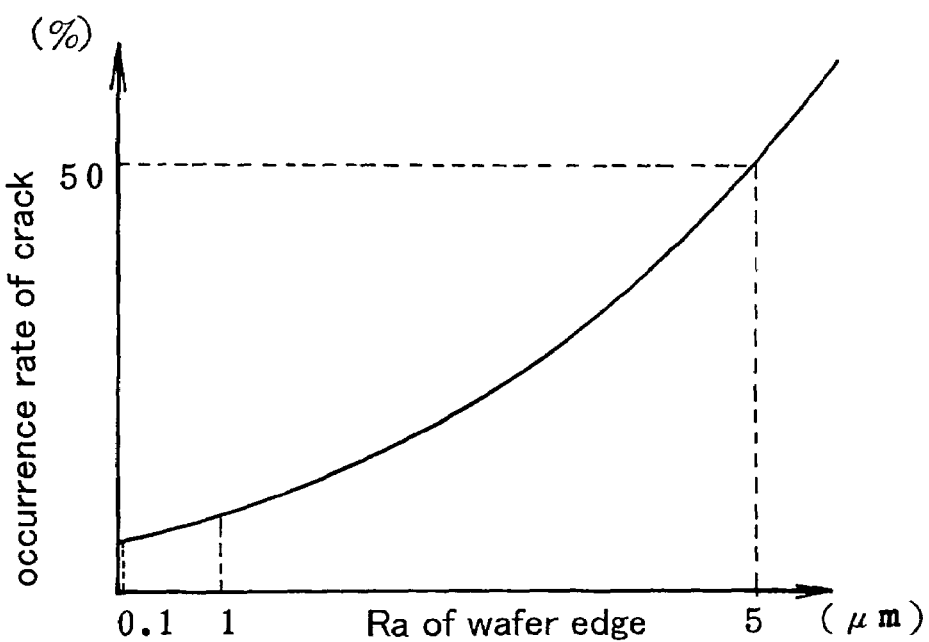
FIG. 4 is a graph for showing a relation between a surface roughness Ra (μm) of edges of GaN wafers and an occurrence rate (%) of cracks. The abscissa is the surface roughness Ra (μm) of edges. The ordinate is the crack occurrence rate (%).

As described before, the first purpose of the present invention is to suppress the roughness of edges of GaN wafers or other nitride wafers under Ra 5 µm (Ra≦5 µm). Such roughness has been accomplished by the first step (Ra 0.9 µm by the whettape of #800 mesh) of bevelling of the embodiment. As clarified in FIG. 4, Ra 1 µm corresponds to 10% of the crack occurrence rate. It is significant to suppress the edge roughness under Ra 1 µm for the sake of preventing cracks from occurring. It is possible to stop the bevelling at the first step which brings about the edge roughness Ra 0.9 µm.

The second bevelling step heightens smoothness of the edge of the GaN wafer up to Ra 300 nm by a finer whettape of #2000. The second step can accomplish the smoothness of the range (2) (Ra 1000 nm to Ra 10 nm) above-cited. It is also possible to finish the chamfer at the second step.

The third bevelling step of the embodiment enhances smoothness of the edge up to Ra 100 nm by the finest whettape of #3000. The third step chamfer can produce excellent smoothness of the edge, which suppresses a crack occurrence rate to 5% to 8%, as exhibited in FIG. 4. There are other factors inducing cracks. Such reduction of the crack occurrence probability is a remarkable effect of the slow tape-bevelling of the present invention.

What we claim is:

1. A method of chamfering a nitride semiconductor wafer comprising the steps of:
    preparing a soft whetting apparatus having a long continually-fed elastic tape and whetting granules of #300 to #5000 implanted on the elastic tape;
    bringing the elastic tape into angular inscribing contact with an edge of the circular nitride wafer with an angular contact angle of 40 degrees to 90 degrees at a pressure;
    supplying the elastic tape with a whetting liquid which is powderless water, powderless oil, powder including water, or powder including oil;
    rotating the nitride wafer in the inscribing contact with the elastic tape;
    feeding the elastic tape at a constant speed or varying speeds of 5 mm/min to 60 mm/min in the angular direction around the wafer edge; and
    abrading the edge of the wafer by the granules implanted on the soft elastic tape into edge roughness of Ra 5 μm to Ra 10 nm, wherein the chamfering method includes three steps, a first step uses a whettape of #300 to #1000, a second step uses another whettape of #1000 to #2500 and a third step uses another whettape of #2500 to #5000.

2. The method according to claim 1, wherein the first step employing a whettape of #800 produces an edge of roughness of Ra 0.9 μm, the second step employing a whettape of #2000 produces an edge of roughness of Ra 0.3 μm and the third step employing a whettape of #3000 produces an edge of roughness of Ra 0.1 m.

* * * * *